United States Patent [19]

Mochizuki et al.

[11] 4,193,826
[45] Mar. 18, 1980

[54] VAPOR PHASE DIFFUSION OF ALUMINUM WITH OR WITHOUT BORON

[75] Inventors: Yasuhiro Mochizuki; Hiroaki Hachino; Yasumichi Yasuda; Yutaka Misawa; Takuzo Ogawa, all of Hitachi, Japan

[73] Assignee: Hitachi, Ltd., Japan

[21] Appl. No.: 931,399

[22] Filed: Aug. 7, 1978

[30] Foreign Application Priority Data

Aug. 15, 1977 [JP] Japan .................. 52/96983

[51] Int. Cl.² ........................... H01L 21/223
[52] U.S. Cl. .................... 148/189; 148/187; 148/190
[58] Field of Search ............. 148/187, 189, 190

[56] References Cited

U.S. PATENT DOCUMENTS

| | | | |
|---|---|---|---|
| 3,562,033 | 2/1971 | Jansen et al. | 148/189 |
| 3,577,287 | 5/1971 | Norwich et al. | 148/189 |
| 3,615,936 | 10/1971 | Batz | 148/187 |
| 3,615,945 | 10/1971 | Yokozawa | 148/190 |
| 3,798,084 | 3/1974 | Lyons | 148/189 |
| 4,029,528 | 6/1977 | Rosnowski | 148/187 |

OTHER PUBLICATIONS

Electrochemical Technology, No. 3-4, Mar.-Apr. 1967, pp. 90-94.
National Technical Report, No. 6, Jun. 1968, Matsushita Electronics Corp., pp. 183-190.

Primary Examiner—G. Ozaki
Attorney, Agent, or Firm—Craig and Antonelli

[57] ABSTRACT

A method of fabricating a semiconductor device through selective diffusion of aluminum vapor into a silicon substrate by heating a sealed tube in which the silicon substrate and an aluminum source are disposed. The diffusion is effected with a low concentration of aluminum smaller than about $10^{17}$ atoms/cm³, thereby making it possible to use a silicon oxide film as a diffusion mask for the selective diffusion of aluminum at predetermined region of the silicon substrate.

12 Claims, 9 Drawing Figures

F I G. 1
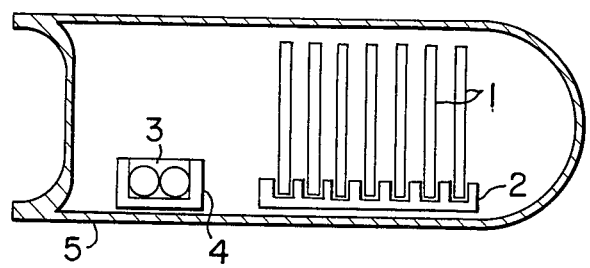
F I G. 2
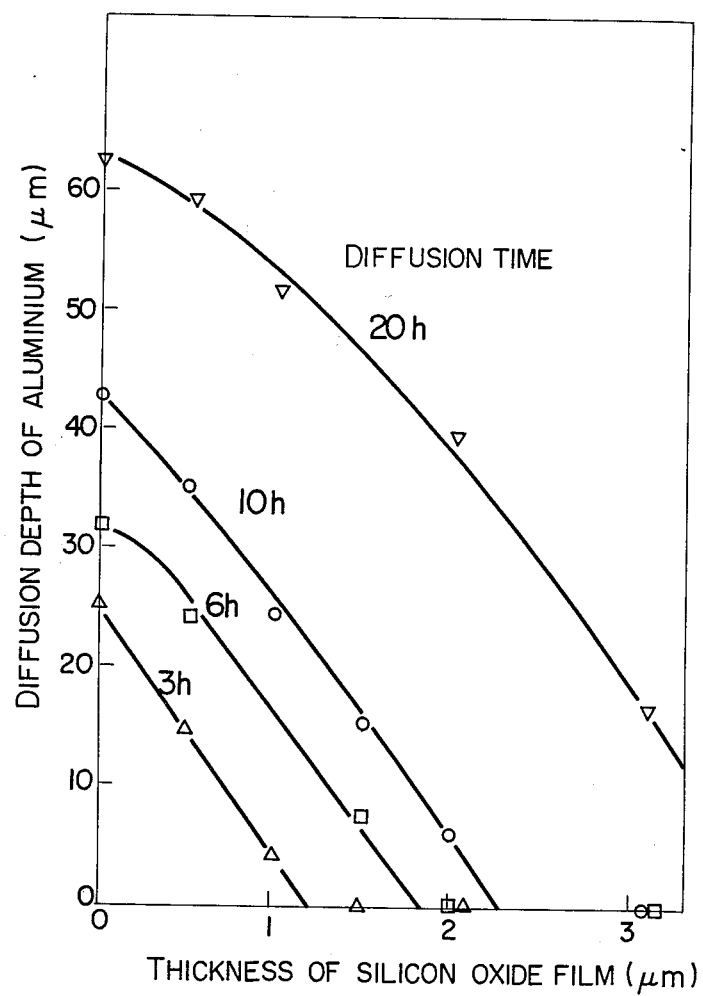

VAPOR PHASE DIFFUSION OF ALUMINUM WITH OR WITHOUT BORON

BACKGROUND OF THE INVENTION

The present invention relates in general to a method of fabricating a semiconductor device and in particular concerns a method of fabricating a semiconductor device through selective diffusion of aluminum in a vapor phase into a silicon substrate at a predetermined region by using a silicon oxide film as a diffusion mask.

As is well known, diffusion of aluminum into the silicon substrate is carried out in a sealed refractory tube or enclosure such as of quartz in which the silicon substrate and an impurity source of aluminum are placed and heated. It is believed that aluminum vapor evaporated from the diffusion source will first react with the quartz of the sealed enclosure and subsequently aluminum atoms are driven into the silicon substrate with a high dopant concentration to a limit of the solid solubility. In this connection, it is also known that the silicon oxide film is utterly useless as the mask for the diffusion of aluminum with a high concentration, since the silicon oxide film is easily reduced by aluminum vapor. Such phenomenon has been already reported in detail by Y.C. Kao of Westinghouse Electric Corporation, Research And Development Center, Pittsburgh, Pa., in an article "On the Diffusion of Aluminium into Silicon" in a periodical "Electrochemical Technology" No. 3-4, pp. 90 to 94. According to the reports of studies heretofore made, the reduction of the silicon oxide film is explained by the fact that aluminum suboxide ($Al_2O$) which is more active than aluminum has a higher vapor pressure in liquefied aluminum and contributes not only to the diffusion of aluminum with a high concentration but also undesirably to the reduction of the silicon oxide film.

There are known a silicon nitride film, alumina film and other composite films as the masking film for the gaseous selective diffusion of aluminum. Among them all, the masking effect of the silicon nitride film is discussed in detail by Masami Yokozawa of Research Lab., Matushita Electronics Corp. in a periodical "National Technical Report" No. 6, 1968, under the title "Diffusion of Aluminium in Silicon By Sealed Quartz Tube Method," a first report of his studies on "Diffusion of Aluminium Into Silicon Crystals." However, there are few practical cases in which the silicon nitride film, alumina film and other composite films are actually employed as the mask for the selective diffusion of aluminum, because difficulties are encountered in the treatments such as photo-etching for forming such films, involving high manufacturing costs and possibility of formation of pin-holes and cracks.

In contrast, the silicon oxide film is immune to these drawbacks and is regarded as an ideal masking material. However, it has been hitherto impossible to use a silicon oxide film as the mask for the gaseous selective diffusion of aluminum for the reasons described above, that is, the reduction of the silicon oxide film by aluminum vapor.

SUMMARY OF THE INVENTION

An object of the invention is to provide a method of fabricating a semiconductor device which allows the silicon oxide film to be used as a diffusion mask for gaseous selective diffusion of aluminum by eliminating difficulties arising in the hitherto known method.

In view of the above and other objects which will become more apparent as description proceeds, there is proposed according to an aspect of the invention a method of fabricating a semiconductor device through gaseous selective diffusion of aluminum into a silicon substrate in a sealed enclosure in which the silicon substrate and at least an aluminum source are placed and heated, wherein a silicon oxide film is used as a diffusion mask to effect selective diffusion with a low impurity concentration at predetermined regions on the silicon substrate so that the concentration of diffused aluminum over the doped surface of the silicon substrate remains lower than a predetermined value.

BRIEF DESCRIPTION OF THE DRAWINGS

FIG. 1 shows in a schematic longitudinal sectional view an exemplary embodiment of a sealed quartz enclosure tube used in carrying out a method of fabricating a semiconductor device according to the invention.

FIGS. 2 to 4 are graphs illustrating relationships among various parameters affecting the masking effect of silicon oxide film for attaining low concentration diffusion of aluminum in a silicon substrate.

DETAILED DESCRIPTION OF THE PREFERRED EMBODIMENTS

Figure 3:
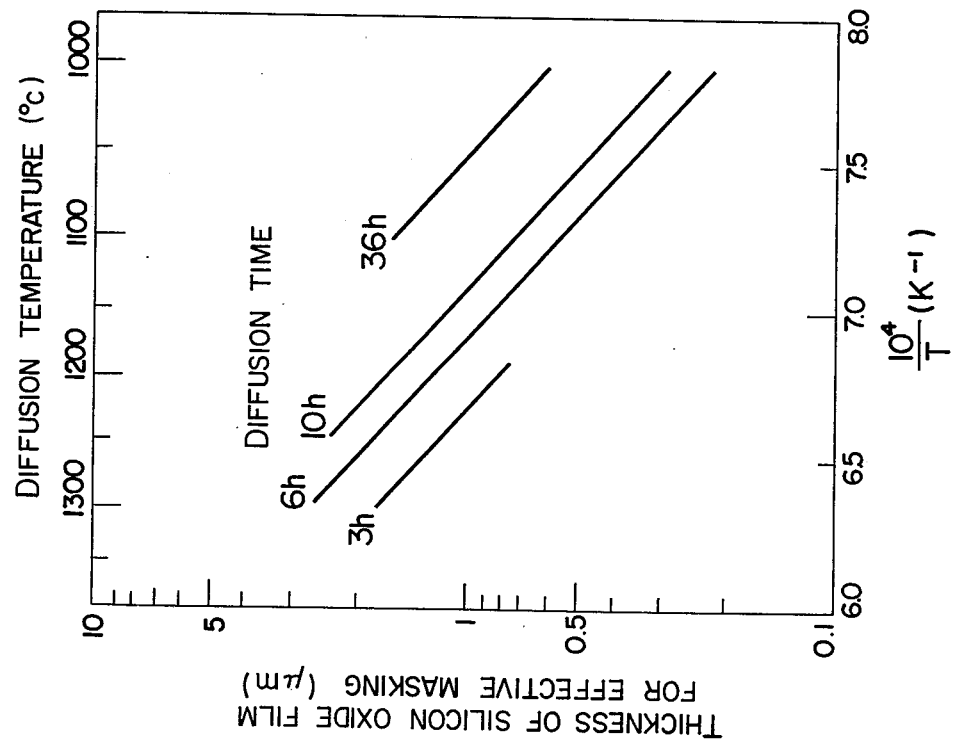

Before entering into a description of exemplary embodiments of the invention, definitions of terminology used herein will be set forth. When the phrase "high concentration diffusion of aluminum" or the like is used, it is to be understood to mean that the concentration of diffused aluminum in a surface of a silicon substrate is on the order of $10^{19}$ atoms/cm$^3$, which approximates the limit of solid solubility of aluminum in silicon, while the phrase "low concentration diffusion of aluminum" or the like is intended to mean that the aluminum concentration in a surface of a silicon substrate is on the order of $10^{17}$ atoms/cm$^3$ or less.

The inventors of the present application have confirmed through experiments that the reducing reaction of the silicon oxide film by aluminum vapor will not take place when the diffusion of aluminum is effected at the low concentration and thus the silicon oxide film will remain effective as the diffusion mask. It is believed that such effect can be explained by the fact that formation of aluminum suboxide (e.g. $Al_2O$) is suppressed, to too small a quantity to reduce the silicon oxide film, in the case of the low concentration diffusion, as compared with that of the high concentration diffusion, while aluminum vapor at a low vapor pressure will contribute to the diffusion thereby to form a stable diffusion layer of the low aluminum concentration.

Now, the invention will be described more concretely by referring to the drawings.

As shown in FIG. 1, a plurality of silicon substrates 1 are supported by a holder 2 and disposed in a sealed quartz enclosure or tube 5 together with a boat 4 containing an aluminum source 3. Diffusion of aluminum into the silicon substrate is carried out by heating the enclosure 5.

For the fabrication of semiconductor devices such as a diode, thyristor or the like which are required to withstand a high breakdown voltage, it is important to reduce the electric field intensity in the region near a pn-junction by controlling the impurity concentration profile in the diffused layer so as to have a gentle or moderate impurity gradient at the junction. Additionally, in order to assure a high breakdown voltage withstanding capability even at a high temperature, it is necessary to increase the depth or thickness of the diffused layer. It has been found that the diffusion of aluminum in an N-type silicon substrate at low concentration is best suited to satisfy the requirements described above. Aluminum is the dopant which exhibits the highest diffusion coefficient in silicon. In reality, the diffusion coefficient of aluminum is ten or more times as high as that of boron and several times as high as that of gallium. Accordingly, the time required for diffusion of aluminum can be reduced correspondingly as compared with boron and gallium. Further, aluminum is advantageous in that crystal lattice distortion in the silicon substrate as well as interactions with other dopants only occur with difficulty.

A silicon oxide film is formed on the silicon substrate 1 in a pattern selected in accordance with the semiconductor device to be manufactured. More particularly, in an exemplary embodiment, an N-type silicon substrate having resistivity of 100 to 120 Ω-cm and crystallographic axis <111> and having no dislocation was prepared and a silicon oxide film of 0.5 to 3.1 μm in thickness was formed on a surface of the silicon substrate through thermal treatment at a temperature ranging from 1000° C. to 1200° C. for 15 to 14 hours in an atmosphere of water vapor. The silicon oxide film thus formed was then windowed at preselected regions through a photo-lithography process to expose the surface of the silicon substrate. The silicon substrate 1 having the silicon oxide film formed in the predetermined pattern as above described was then placed in a quartz tube together with an aluminum wire 3 of 99.9995% purity disposed in a quartz boat 4. Subsequently, the quartz tube was charged with argon gas in such quantity that the pressure of argon gas at the diffusion temperature became equal to the atmospheric pressure. Thereafter, the quartz tube was hermetically sealed to form the sealed enclosure 5. A selective diffusion layer of aluminum with a low surface concentration in the order of $3 \times 10^{16}$ atoms/cm$^3$ was formed in the silicon substrate through heat treatment.

With a view to proving that the silicon oxide film serves effectively as the diffusion mask, the windowed regions and the masked regions of the silicon substrate formed with the diffusion layer in the manner described above were examined with respect to the diffusion profile of aluminum. To this end, the silicon substrate was polished away in bevel and the depth spreading resistance profile was measured.

FIG. 2 graphically illustrates relationships between the thickness of the silicon oxide film and the depth of the underlying aluminum diffusion layer, with varying diffusion times of 3 hours to 20 hours for the case where the low concentration diffusion was effected to realize the surface concentration of $3 \times 10^{16}$ atoms/cm$^3$ in the silicon substrate 1.

In the case in which the diffusion was effected for 10 hours by way of example, it will be seen from FIG. 2 that the depth of aluminum diffusion layer is about 42 μm in the windowed or exposed region where no silicon oxide film is present. When the silicon oxide film on the substrate is 2 μm thick, the depth of the underlying aluminum diffusion layer is about 6 μm.

Such difference in the diffusion depth of aluminum is ascribable to the difference in diffusion rate of aluminum between the silicon substrate and the silicon oxide film. In order that the silicon oxide film serves effectively as the diffusion mask, the diffusion depth of aluminum in the region underlying the silicon oxide film has to be zero. The results of the examination illustrated in FIG. 2 show that the thickness of the silicon oxide film must then be about 2.3 μm or more. It will be thus appreciated that the silicon oxide film of about 2 μm will effectively serve as the diffusion mask for the diffusion time of 6 hours.

The diffusion rate of aluminum in the silicon oxide film is approximately 2.0 to $2.5 \times 10^{-3}$ times as great as the diffusion rate of aluminum in silicon at the diffusion temperature of 1250° C., as calculated on the basis of the slope of the curve shown in FIG. 2. In a similar manner, the diffusion rate of aluminum in the silicon oxide film is approximately $3.1 \times 10^{-3}$ times as great as the diffusion rate of aluminum in silicon at the diffusion temperature of 1000° C.

FIG. 3 illustrates graphically the resulting experimental relationships between the diffusion time and the thickness of the silicon oxide film required for effective masking, with the diffusion temperature employed as a parameter, for the low concentration diffusion of aluminum.

Figure 4:
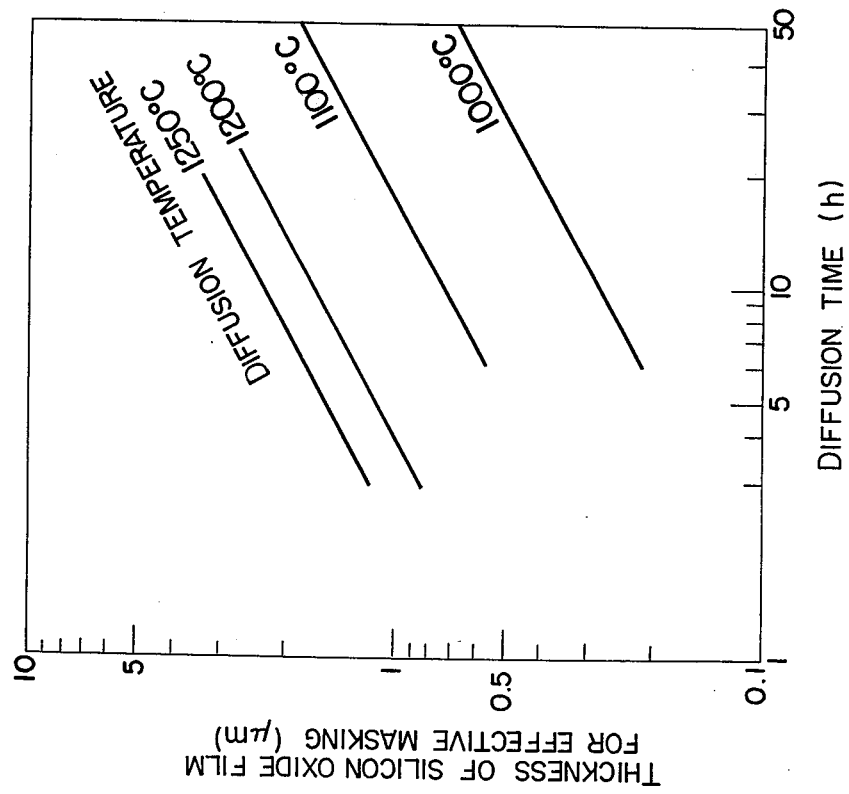

On the other hand, FIG. 4 illustrates relationships between the diffusion temperature and the thickness of silicon oxide film required for effective masking with the diffusion time used as parameter for the low concentration diffusion of aluminum.

It has been found that the silicon oxide film becomes at least partially crystallized when the film is exposed to aluminum vapor for a long time at a high temperature. Upon occurrence of such crystallization, cracks will be produced in the boundary between the crystallized region and the amorphous region of the silicon oxide film or in the intergranular region. Then, aluminum will be diffused into silicon through such cracks, deteriorating the selectivity in the diffusion pattern.

Figure 5:
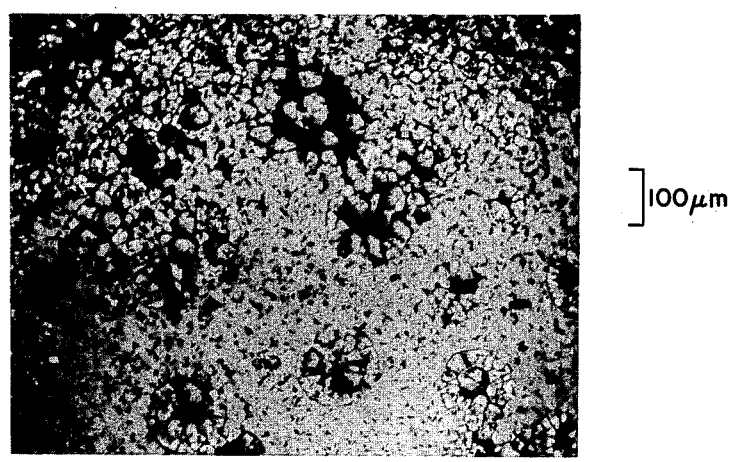
FIG. 5 is a micro-photograph showing the crystallized state of a silicon oxide film under the influence of aluminum vapor.
Figure 6:
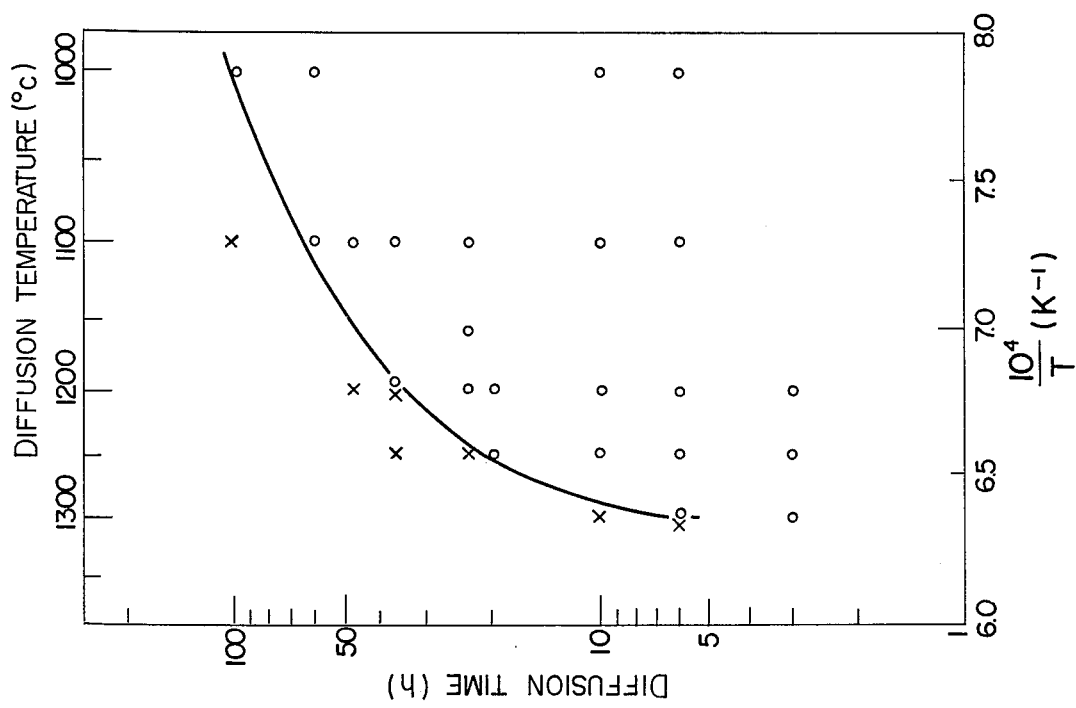
FIG. 6 illustrates graphically a relationship between diffusion temperature and diffusion time when aluminum diffusion is effected with a low diffusion concentration.

FIG. 5 shows a photograph of a silicon oxide film taken by a differential interference microscope to show the crystallization and the cracks produced in the silicon oxide film. Through X-ray diffraction pattern analysis, it has been found that α-cristobalite is locally formed. Thus, the heating at a high temperature for a long duration is disadvantageous for the low concentration diffusion of aluminum. For the purpose of determining the limits of diffusion temperature and diffusion time, microscopic examination was made on the silicon oxide films treated under various diffusing conditions. The results are illustrated in FIG. 6 in which relationships between the diffusion temperature and the diffusion time are graphically shown. In the graph, the symbol "o" indicates that no cristobalite is formed, while the symbol "x" indicates that cristobalite is formed at least partially. It should be mentioned that the thickness of the silicon oxide film exerts no influence on this relation. As can be seen from FIG. 6, in order to carry out satisfactorily the selective diffusion of aluminum at the low concentration by using the silicon oxide film as the mask, the diffusion temperature and time should be selected in the range lying below a curve shown in FIG. 6.

Next, description will be made of how to attain the desired low concentration of diffused aluminum in the surface of a silicon substrate.

Referring again to FIG. 1, it is known that the concentration of diffused aluminum is affected by the material of the alumimum source boat 4, type and amount of the aluminum source 3 as well as the atmosphere in the sealed tube 5.

Figure 7:
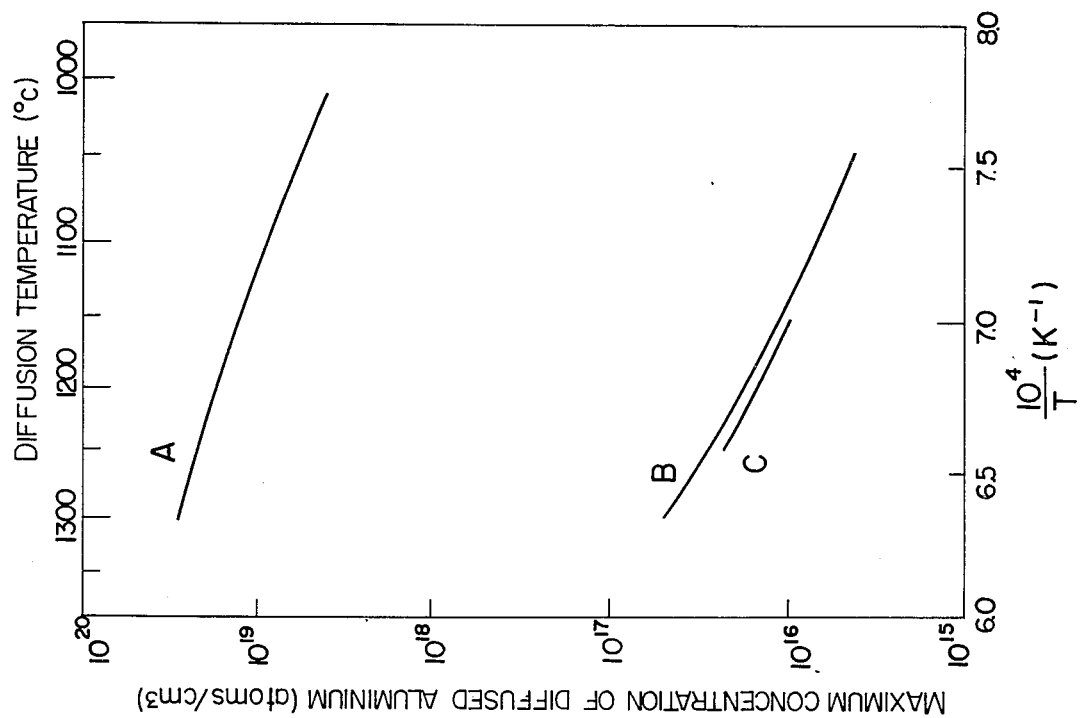
FIGS. 7 to 9 illustrate graphically relationships of maximum diffusion concentration of aluminum to various factors when aluminum is diffused into a silicon substrate.

FIG. 7 shows the influence of the material forming the diffusion source container boat 4 on the concentration of diffused aluminum. In this figure, the curve A represents the case in which the boat 4 is made of high purity alumina porcelain or sapphire, curve B represents the case in which the boat 4 is made of silicon and curve C corresponds to the boat made of quartz. Aluminum wire of 99.9995% in purity was used as the diffusion source 3. Diffusion was carried out in an evacuated and sealed quartz tube 5 for 10 hours under heating at the various diffusion temperatures as indicated in FIG. 7. It can be seen that the use of a boat made of alumina or sapphire results in formation of the diffused layer having a high impurity concentration, while the boat of silicon or quartz allows a low concentration diffusion layer to be formed in a stable manner.

Figure 8:
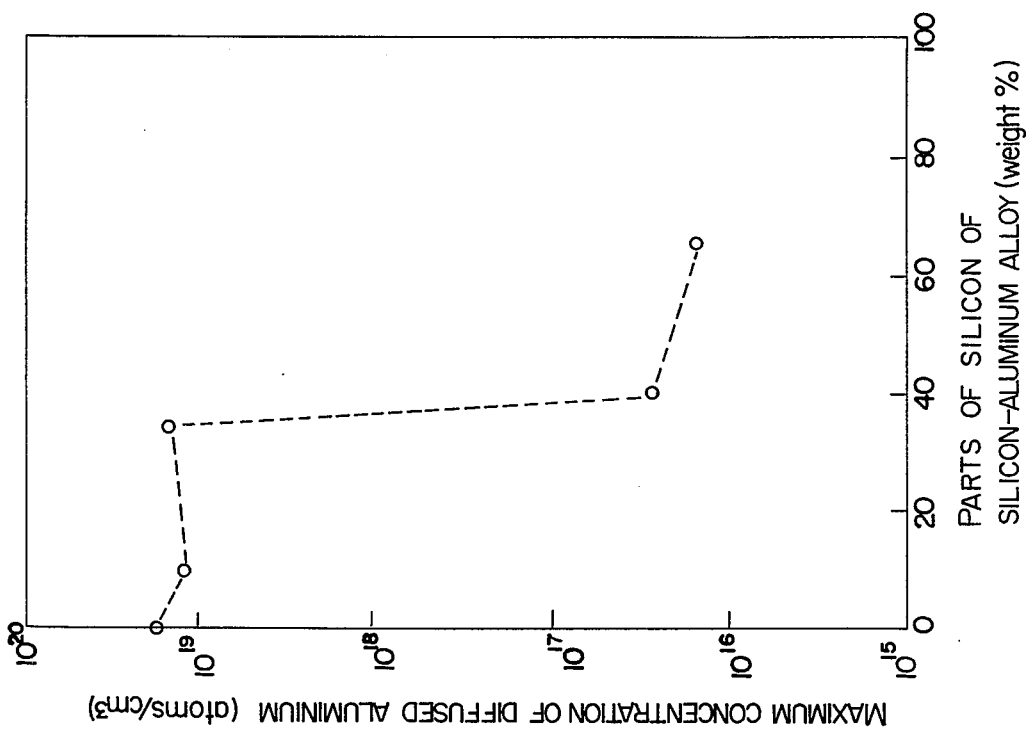

FIG. 8 shows the influence of the type of aluminum diffusion source exerted on the concentration of the diffusion layer. For the measurement, 1.2 gr. of Al-Si alloys were used as the diffusion source contained in the source boat of alumina and diffusions were effected with parts of Si varied while heating in the evacuated and sealed quartz tube at 1200° C. for 10 hours. It will be seen that there is a specific composition of Al-Si alloy with which the concentration of diffused aluminum is abruptly lowered.

Figure 9:
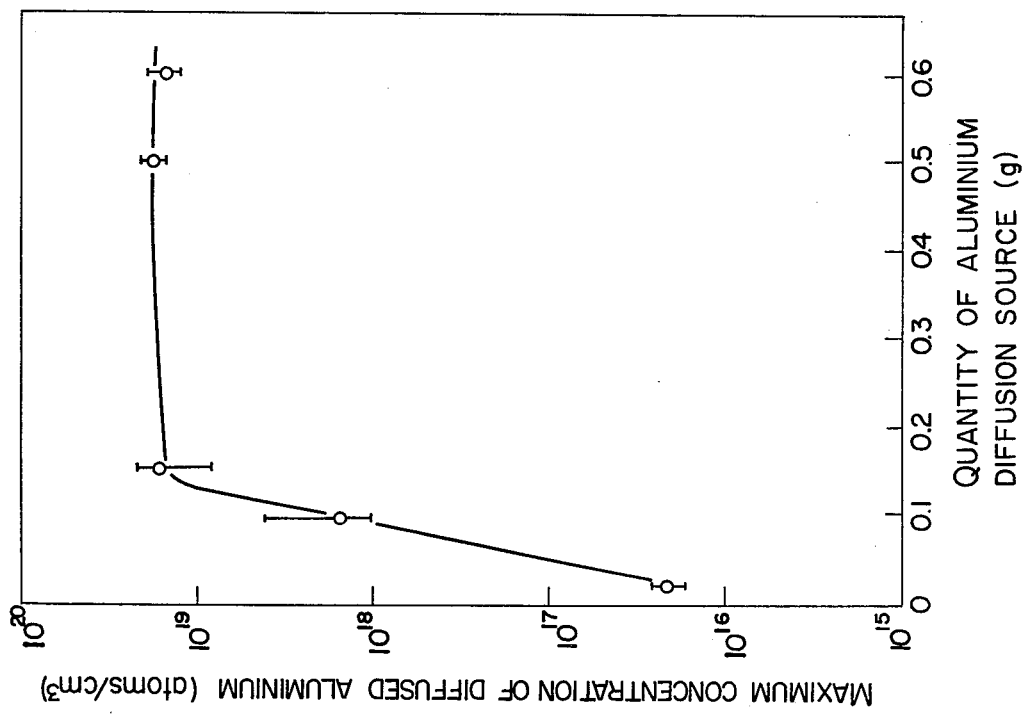

FIG. 9 illustrates the influence of the quantity of the aluminum diffusion source the the attainable diffusion concentration. For the measurement, aluminum wires were used as the diffusion source at 1200° C. for 10 hours in the evacuated and sealed quartz tube of 20 mm in diameter having lengths in the range of 8 to 10 cm. It can be seen from FIG. 9 that a smaller quantity of aluminum diffusion source will contribute to the desired low concentration diffusion.

Finally, influence of the atmosphere in the sealed tube exerted to the concentration of diffused aluminum was examined. The results are listed in the following table.

necessary to resort to all the factors described above, but one selected factor will be sufficient. Selection of such a factor will be a matter of choice in design for those skilled in the art in consideration of the specifications of the semiconductor devices to be fabricated.

As described hereinbefore, limitation is imposed on the diffusion temperature and the diffusion time in the selective diffusion of aluminum with the desired low concentration using silicon oxide film as the diffusion mask. In other words, limit is imposed on the depth of diffusion or the thickness of the aluminum-diffusion layer. In practice, the depth of selectively diffused aluminum layer is highest at about 60 $\mu$m for an N-type silicon substrate having a resistivity in the range of 100 to 120 $\Omega$-cm. Nevertheless, a diffusion layer having a greater depth is required for the fabrication of such a semiconductor device which is capable of withstanding a higher breakdown voltage. In such an application, after the selective diffusion of aluminum described above, additional selective diffusion of aluminum has to be carried out with the silicon oxide film being formed again. Alternatively, a desired diffusion depth may be attained through a thermal drive-in process after the silicon oxide mask has been removed. However, such thermal drive-in technique will often result in a remarkably and undesirably lowered concentration of aluminum in the surface of the silicon substrate, because aluminum is out-diffused from the silicon substrate to an atmosphere very rapidly, to be dispersed laterally.

According to an aspect of the invention, such a disadvantage as described above can be eliminated by employing a boron diffusion source in addition to the aluminum diffusion source in the thermal drive-in process. By way of example, a silicon substrate having a silicon oxide film formed as a diffusion mask was placed in a sealed quartz tube together with an aluminum diffusion source and a boron diffusion source and heated thereby to allow aluminum and boron to be diffused simultaneously into the silicon substrate. Since the silicon oxide film exhibits an efficient masking effect to boron and the diffusion rate of boron is low as compared with that of aluminum, as is well known, the impurity concentration will undergo little decrease through the thermal drive-in diffusion. In other words, it has been found that the diffusion depth can be controlled by aluminum, while surface concentration can be controlled by boron.

EXAMPLE

N-type silicon substrate having a resistivity of 100 to 120 $\Omega$-cm and crystallographical axis <111> was pre- Table

| Filled Gas and Pressure (Torr) | Vacuum | He (200) | Ar (160~180) | He (250) | Ar (250) | Vacuum |
|---|---|---|---|---|---|---|
| Diffusion temperature (°C.) | 1200 | 1200 | 1200 | 1000 | 1000 | 1000 |
| Maximum concentration of diffused aluminum (atoms/cm$^3$) | $2 \times 10^{19}$ | $1 \times 10^{17}$ | $3 \times 10^{16}$ | $2 \times 10^{16}$ | $2 \times 10^{16}$ | $6 \times 10^{18}$ |

From the table, it can be seen that the atmosphere of an inert gas is preferred for attaining a low concentration of aluminum diffusion.

From the foregoing description, it will be appreciated that diffusion of aluminum with low concentration can be accomplished by various factors. However, it is unpared and a silicon oxide film of 3.1 $\mu$m thick was formed on a surface of the silicon substrate by heating at 1200° C. for 14 hours in the presence of water vapor. Subsequently, a window was opened in the silicon oxide layer through photo-lithography at a region in which p-type diffusion layer was to be formed. The silicon substrate thus obtained was placed, together with a quartz boat for the aluminum source and silicon wafers doped with boron to a concentration of $3\times 10^{18}$ to $6\times 10^{18}$ atoms/cm$^3$, in a quartz tube in which argon gas was charged and sealed. The quartz tube was heated at 1250° C. for 10 hours thereby to diffuse aluminum and boron into the silicon substrate selectively through the silicon oxide mask. After the silicon oxide film had been etched away, thermal drive-in was carried out at 1250° C. for 12 hours. A p-type selectively diffused layer was formed in the silicon substrate with a diffusion depth of 68 μm at a surface impurity concentration of $3\times 10^{17}$ to $6\times 10^{17}$ atoms/cm$^3$.

In the above example, boron and aluminum are simultaneously diffused. However, it is of course possible to diffuse them separately in sequence, which however would involve an increased number of processing steps and hence is rather expensive.

As will be appreciated from the foregoing description, the invention has provided a method of fabricating a semiconductor device in which selective diffusion of aluminum into silicon substrate can be made by using a silicon oxide mask and which allows a p-type diffusion layer having a great depth to be formed in a relatively short time.

We claim:

1. A method of fabricating a semiconductor device through selective diffusion of aluminum in a vapor phase into a silicon substrate by heating a sealed enclosure in which said silicon substrate and an aluminum diffusion source are disposed, wherein said selective diffusion of aluminum is carried out in a predetermined surface region of said silicon substrate with a low aluminum concentration smaller than a predetermined value and using a silicon oxide film as a diffusion mask, said silicon oxide film having apertures at said predetermined surface region of said silicon substrate, through which aluminum is selectively diffused into the silicon substrate.

2. A method of fabricating a semiconductor device as set forth in claim 1, wherein said predetermined value of the concentration of aluminum is in the order of $10^{17}$ atoms/cm$^3$.

3. A method of fabricating a semiconductor device as set forth in claim 2, wherein said sealed enclosure is filled with an inert gas so as to have substantially an atmospheric pressure when heated at a diffusion temperature in the range of 1000° to 1250° C.

4. A method of fabricating a semiconductor device as set forth in claim 2, wherein said diffusion source of aluminum is contained in a diffusion source container made of either silicon or quartz thereby to adjust the surface concentration of the diffused aluminum.

5. A method of fabricating a semiconductor device as set forth in claim 1, wherein a diffusion source of boron is additionally contained in the sealed enclosure and selective diffusion of boron is carried out in said predetermined surface region of said semiconductor substrate, whereby the depth of diffusion is controlled by aluminum, while the surface impurity concentration of said silicon substrate is controlled by diffused boron.

6. A method of fabricating a semiconductor device as set forth in claim 5, wherein said diffusion sources of aluminum and boron are constituted by silicon containing aluminum and boron.

7. A method of fabricating a semiconductor device as set forth in claim 5, wherein selective diffusion of aluminum and boron into a silicon substrate is carried out by using said silicon oxide film as a diffusion mask and then a drive-in diffusion is carried out after said silicon oxide film is removed.

8. A method of fabricating a semiconductor device as set forth in claim 5, wherein the aluminum and boron are simultaneously selectively diffused into the silicon substrate.

9. A method of fabricating a semiconductor device as set forth in claim 1, wherein the sealed enclosure is heated at a temperature and for an amount of time such that the silicon oxide film does not form into α-cristobalite.

10. A method of fabricating a semiconductor device as set forth in claim 9, wherein, after the sealed enclosure has been heated at a temperature and for a time such that α-cristobalite is not formed, whereby aluminum is selectively diffused into the silicon substrate, a silicon oxide film is again formed on the silicon substrate and formed into a diffusion mask, and then said silicon substrate and an aluminum diffusion source are disposed in a sealed enclosure and heated such that a further selective diffusion of aluminum is carried out, whereby a diffusion layer having a greater depth than after the first diffusion is formed.

11. A method of fabricating a semiconductor device as set forth in claim 1, wherein an Al-Si alloy is used as the aluminum diffusion source.

12. A method of fabricating a semiconductor device as set forth in claim 1, wherein said silicon oxide film has a thickness of 0.5 to 3.1 μm.

* * * * *